United States Patent
Jeon

(10) Patent No.: US 8,305,811 B2
(45) Date of Patent: Nov. 6, 2012

(54) FLASH MEMORY DEVICE AND METHOD OF READING DATA

(75) Inventor: Su-chang Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 365 days.

(21) Appl. No.: 12/780,982

(22) Filed: May 17, 2010

(65) Prior Publication Data

US 2010/0322007 A1 Dec. 23, 2010

(30) Foreign Application Priority Data

Jun. 19, 2009 (KR) .................. 10-2009-0054980

(51) Int. Cl.
*G11C 16/04* (2006.01)

(52) U.S. Cl. .............................. 365/185.18; 365/185.12

(58) Field of Classification Search ............. 365/185.18, 365/185.12, 201
See application file for complete search history.

(56) References Cited

U.S. PATENT DOCUMENTS

| 2007/0091677 A1 | 4/2007 | Lasser et al. |
| 2010/0020616 A1* | 1/2010 | Auclair et al. ........... 365/185.18 |

FOREIGN PATENT DOCUMENTS

| JP | 2007323731 A | 12/2007 |
| JP | 2008066466 A | 3/2008 |

* cited by examiner

*Primary Examiner* — Huan Hoang

(74) *Attorney, Agent, or Firm* — Volentine & Whitt, PLLC

(57) ABSTRACT

A flash memory device and method of reading data are disclosed. The method includes; performing a test read operation directed to test data stored in a memory cell array of the flash memory device by iteratively applying a sequence of test read retry operations, wherein each successive test read retry operation uses a respectively higher test read voltage level than a preceding test read retry operation, until one test read retry operation in the sequence of test read retry operations successfully reads the test data using a minimum test read retry voltage associated with the one test read retry operation, setting an initial read voltage for the flash memory device equal to the minimum test read retry voltage, and thereafter performing a normal read operation directed to user data stored in the memory cell array by iteratively applying a sequence of read retry operations, wherein an initial read retry operation in the sequence of read retry operations uses the initial read voltage.

18 Claims, 7 Drawing Sheets

FLASH MEMORY DEVICE AND METHOD OF READING DATA

CROSS-REFERENCE TO RELATED APPLICATIONS

This application claims the benefit of Korean Patent Application No. 10-2009-0054980 filed on Jun. 19, 2009, the subject matter of which is hereby incorporated by reference.

BACKGROUND

The inventive concept relates to flash memory devices and method of reading data from flash memory devices. More particularly, the inventive concept relates to a data storage device incorporating a flash memory device, wherein the lifetime of the data storage device may be extended by filtering the data to-be-stored in the flash memory.

So-called "flash memory" is a particular type of Electrically Erasable Programmable Read Only Memory (EEPROM). The EEPROM is a type of nonvolatile memory that is able to retain stored data in the absence of applied power.

Since flash memory may be very densely integrated to provide a small-sized memory system capable of storing a great deal of data, it is commonly used within many mobile apparatuses such as cellular phones, personal digital assistants (PDAs), digital cameras, portable game consoles and MP3 players to store code data and/or end user (or payload) data. Flash memory is also increasingly used in certain home applications, such as high definition televisions (HDTVs), digital versatile disks (DVDs), routers and global positioning systems (GPSs).

SUMMARY

Embodiments of the inventive concept provides a flash memory device ensuring relatively fast data read speed (i.e., relatively fast access to data stored in the flash memory device) as well as improving overall reliability of the flash memory device. Embodiments of the inventive concept also provide an improved method of reading data from the flash memory device.

According to various aspects of the inventive concept, there are provided a method of reading user data from a flash memory device, a flash memory device, and a computational system incorporating the flash memory device.

In a exemplary method embodiment of the inventive concept, the method comprises; performing a test read operation directed to test data stored in a memory cell array of the flash memory device by iteratively applying a sequence of test read retry operations, wherein each successive test read retry operation uses a respectively higher test read voltage level than a preceding test read retry operation, until one test read retry operation in the sequence of test read retry operations successfully reads the test data using a minimum test read retry voltage associated with the one test read retry operation, setting an initial read voltage for the flash memory device equal to the minimum test read retry voltage, and thereafter performing a normal read operation directed to user data stored in the memory cell array by iteratively applying a sequence of read retry operations, wherein an initial read retry operation in the sequence of read retry operations uses the initial read voltage.

In a related aspect, performing the test read operation is begun upon receiving power to the flash memory device during a power-up operation.

In another related aspect, the method further includes; reading set data stored in the flash memory device after the power-up operation and before performing the test read operation to identify a test address at which the test data is stored, and obtain read retry information defining a read retry start voltage, wherein an initial test read retry operation in the sequence of test read retry operations is performed using the read retry start voltage.

In another related aspect, the sequence of read retry operations in the normal read operation comprises the initial read retry operation through an Nth read retry operation, and each read retry operation in sequence of read retry operations uses a respectively higher read voltage ranging from the initial read voltage having a lowest level to an Nth read voltage having a highest level.

In another related aspect, upon applying the Nth read retry operation and still failing to successfully read the user data, the method further includes; redefining the sequence of read retry operations to additionally include an N+1 read retry operation using a N+1 read voltage having a level higher than the highest level.

In another related aspect, upon redefining the sequence of read retry operations to additionally include the N+1 read retry operation, the method further includes extending a time period within the flash memory device during which the normal read operation may be performed.

In another related aspect, the test read data may be stored in a designated test block within the memory cell array of the flash memory device, and the user data may be stored in a user data region separately designated from the test block. The test data may be stored in a designated test page within the test block, and the test page may be a first page in the test block, a last page in the test block, or an intermediate page between the first and last pages in the test block.

In another embodiment of the inventive concept, there is provided a flash memory device comprising; a memory cell array comprising a set data region, a test block, and a user data region, a controller configured to control the execution of a normal read operation directed to user data stored in the user data region, and execution of a test read operation directed to test data stored in the test block, wherein execution of the normal read operation comprises iteratively applying a sequence of read retry operations, and execution of the test read operation comprises iteratively applying a sequence of test read retry operations, such that each successive test read retry operation uses a respectively higher test read voltage level than a preceding test read retry operation, until one test read retry operation in the sequence of test read retry operations successfully reads the test data using a minimum test read retry voltage associated with the one test read retry operation, and a read retry start voltage setting unit configured to store the minimum test read retry voltage as an initial read voltage, wherein the sequence of read retry operations comprises the initial read retry operation through an Nth read retry operation, and each read retry operation in the sequence of read retry operations uses a respectively higher read voltage ranging from the initial read voltage having a lowest level to an Nth read voltage having a highest level.

In yet another embodiment of the inventive concept, there is provided a computational system comprising; a central processing unit connected to a flash memory device via a system bus and configured to control execution of a normal read operation directed to user data stored in the flash memory device, wherein the flash memory device has at least some of the foregoing structural and functional aspects.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
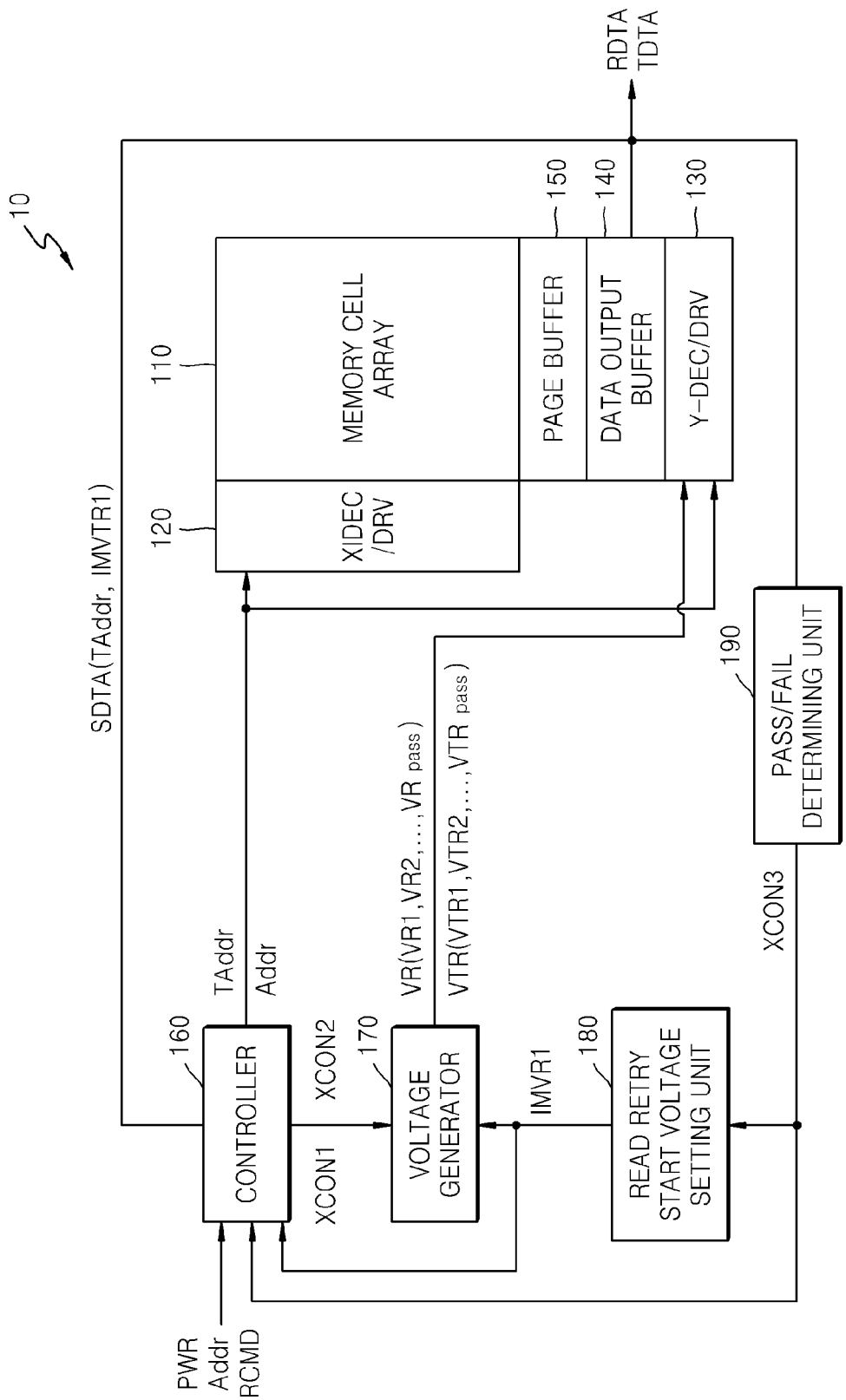
FIG. 1 is a block diagram of a flash memory device according to an embodiment of the inventive concept.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in some additional detail with reference to the accompanying drawings. However, the inventive concept may be variously embodied and should not be construed as being limited to only the illustrated embodiments. Throughout drawings and written description like reference numbers and labels refer to like or similar elements.

FIG. (FIG.) 1 is a block diagram of a flash memory device 10 according to an embodiment of the inventive concept. Flash memory device 10 generally comprise; a memory cell array 110, a page buffer 150, an X-decoder/driver 120, a Y-decoder/driver 130, a data output buffer 140, a controller 160, a voltage generator 170, a read retry start voltage setting unit 180, and a pass/fail determining unit 190.

In the illustrated example of FIG. 1, the controller 160 receives a read command (RCMD) and an address (Addr) from outside the controller 160. The externally provided address (Addr) may indicate a logical and/or a physical location within the memory cell array 110 associated with the "read data" to be read. The controller 160 transmits the address (Addr) to the X-decoder/driver 120 and the Y-decoder/driver 130.

The X-decoder/driver 120 activates a page ("the activated page") identified by the address (Addr) from among the plurality of pages in the memory cell array 110. The page buffer 150 then stores the activated page, as activated by the X-decoder/driver 120.

The Y-decoder/driver 130 then activates one or more columns in response to the address (Addr) from within the activated page stored in the page buffer 150. The column data identified from the activated page stored in the page buffer is then output via the data output buffer 140.

The controller 160 transmits a first control signal (XCON1) corresponding to the read command (RCMD) to the voltage generator 170. The voltage generator 170 then generates a read voltage (VR) in response to a first control signal (XCON1), and transmits the read voltage (VR) to the Y-decoder/driver 130.

Figure 2A:
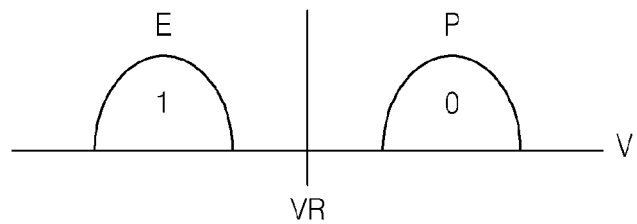
FIGS. 2A and 2B are conceptual diagrams illustrating cell distribution for a single-level cell (SLC) flash memory and cell distribution for a multi-level cell (MLC) flash memory, respectively according to an embodiment of the inventive concept.

FIG. 2A is a conceptual diagram illustrating cell distribution for a single-level cell (SLC) flash memory according to an embodiment of the inventive concept. A single read voltage (VR) may be set at a voltage level between cell distributions associated respectively with an Erase (E) data state and a Program (P) data state for the SLC memory cells within the flash memory device 10, as illustrated in FIG. 2A.

Figure 2B:
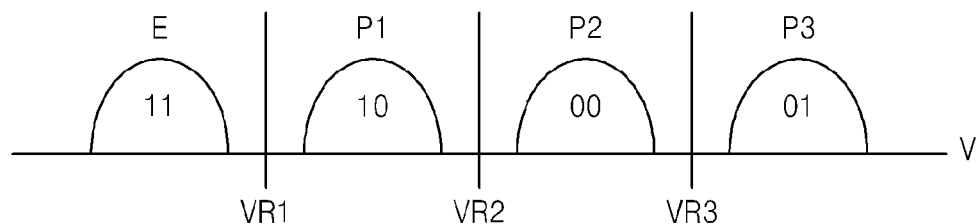

FIG. 2B is another conceptual diagram illustrating cell distribution of a multi-level cell (MLC) flash memory according to an embodiment of the inventive concept. Multiple read voltages (e.g., VR1, VR2, and VR3) may be set at respective voltage levels between adjacent cell distributions associated respectively with an Erase (E) data state (11), a first Program (P1) data state (10), a second Program (P2) data state (00), and a third Program (P3) data state (01) for the MLC (e.g., 2-bit) memory cells within the flash memory device 10, as illustrated in FIG. 2B.

As illustrated by the cell distribution relationship in FIG. 2A, a single read voltage (VR) may effectively be used to differentiate between the two possible data states, E or P. On the other hand and as illustrated by FIG. 2B, three read voltages VR1, VR2, VR3 must be used to differentiate between the four possible data states E, P1, P2 and P3.

Those skilled in the art understand that over time and repeated use (i.e., the repeated application of erase and program operation) flash memory devices become fatigued and will generally deteriorate in their operating performance. One characteristic of this performance deterioration is the migration and/or broadening of the cell distributions associated with various data states.

Figure 3A:
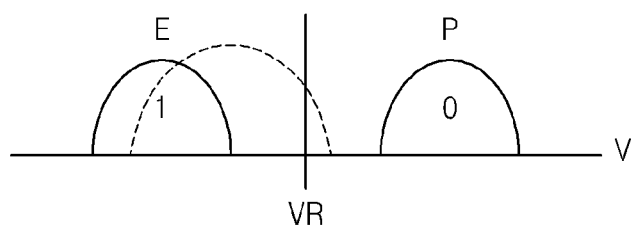
FIGS. 3A and 3B are diagrams conceptually illustrating possible changes over time in the cell distributions of a fatigued flash memory device, such as the one illustrated in FIGS. 2A and 2B.
Figure 3B:
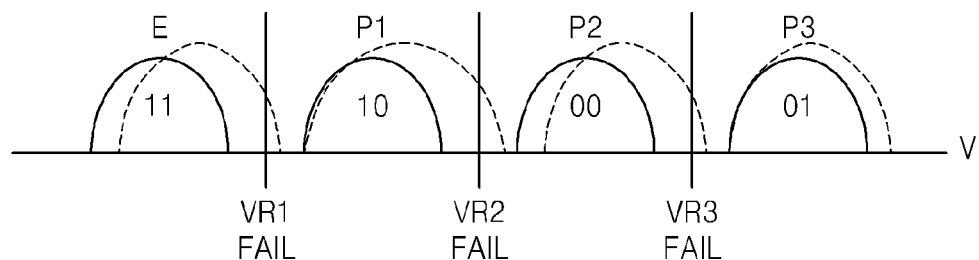

FIGS. 3A and 3B are conceptual diagrams further illustrating changes that may possible occur over time to the cell distributions of a fatigued flash memory device. Referring to FIGS. 3A and 3B, cell distribution changes from the ideal (or a corresponding design specification) are indicated by dashed lines relative to ideal cell distribution illustrated in solid lines. Additionally, the application of the read voltage (VR) during a read operation and in relation to a changed cell distribution for the erase data state (E) is shown in FIG. 3A, and the application of the multiple read voltages (VR1, VR2 and VR3) during a read operation and in relation to changed cell distributions for the erase state (E) and program states (P1, P2, and P3) is shown in FIG. 3B. Because the various cell distributions in FIGS. 3A and 3B have migrated and or broadened from their ideal or specified ranges, the constituent read operations are very likely to fail. As one may note from FIG. 3B, the problem of cell distribution is more serious for the MLC flash memory devices which enjoy much smaller "read margins" between adjacent cell distributions, as compared with SLC flash memory devices.

Again, as is understood by those skilled in the art, read operations are performed in contemporary flash memory devices using an iterative (or looping) approach. Thus, if a read attempt fails, the level of certain control signals defining the read operation may be changed, and a next successive read attempt may be made using the adjusted control signal levels. It is quite common in this iterative approach to executing a read operation to adjust the level of read voltage(s) for each succeeding read attempt in order to improve overall reliability of the flash memory device.

Figure 4:
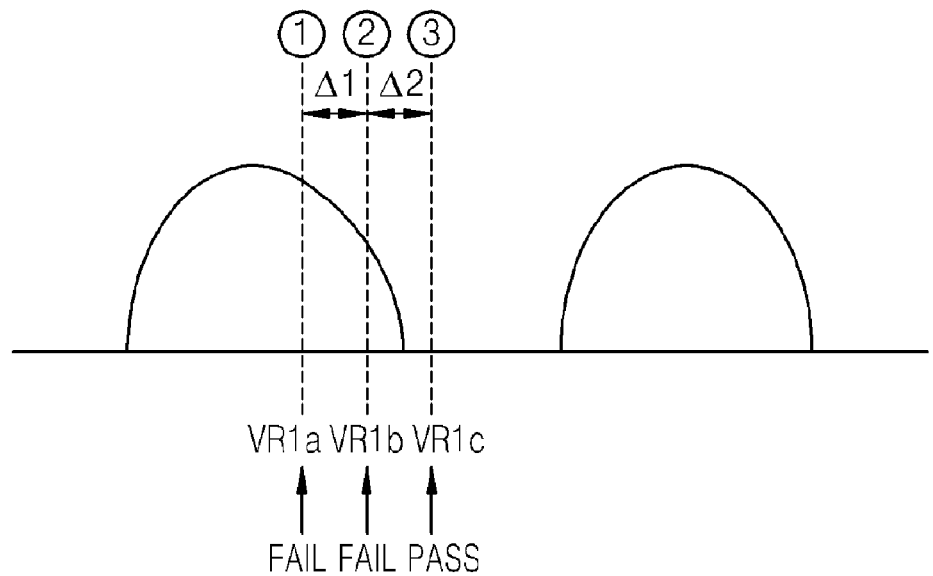
FIG. 4 is a conceptual diagram further illustrating a read retry operation in the flash memory device of FIG. 1 according to an embodiment of the invention concept.

FIG. 4 is a conceptual diagram assuming the operation of the flash memory device 10 during a read operation. The read operation begins by setting a read voltage VR1 to a first (or initial) level (VR1$a$). However, if an initial iteration of the read operation fails using the first level read voltage (VR1$a$), then the flash memory device 10 controls the read operation to execute a second iteration after increasing the read voltage to a second level (VR1$b$) higher than the first level (VR1$a$) by a first adjustment value ($\Delta 1$). If the second iteration of the read operation also fails, the flash memory device 10 controls the read operation to execute a third iteration after increasing the read voltage to a third level (VR1$c$) higher than the second level (VR1$b$) by a second adjustment value ($\Delta 2$).

As suggested by the example illustrated in FIG. 4, this iterative approach of "retrying" a read operation using an increasing (or decreasing) read voltage may continue until the data is successfully read, provided however that the overall operating speed for the flash memory device is not adversely impacted or the read voltage has not reached its maximum level. Hereafter, for ease of reference, each read attempt including an initial iteration in a sequence of read attempts will be referred to as a "read retry."

In the illustrated embodiment of FIG. 4, the first and second adjustment values ($\Delta 1$ and $\Delta 2$) applied respectively to the first and second level read voltages (VR1$a$ and VR1$b$) are assumed to be equal in magnitude. However, this need not be the case, and various "read voltage adjustment values" distinguishing between first level, second level, third level, etc., read voltages (VR1$a$, VR1$b$, VR1$c$ ...) may be used according to the dictates of a particular memory system design.

Figure 5:
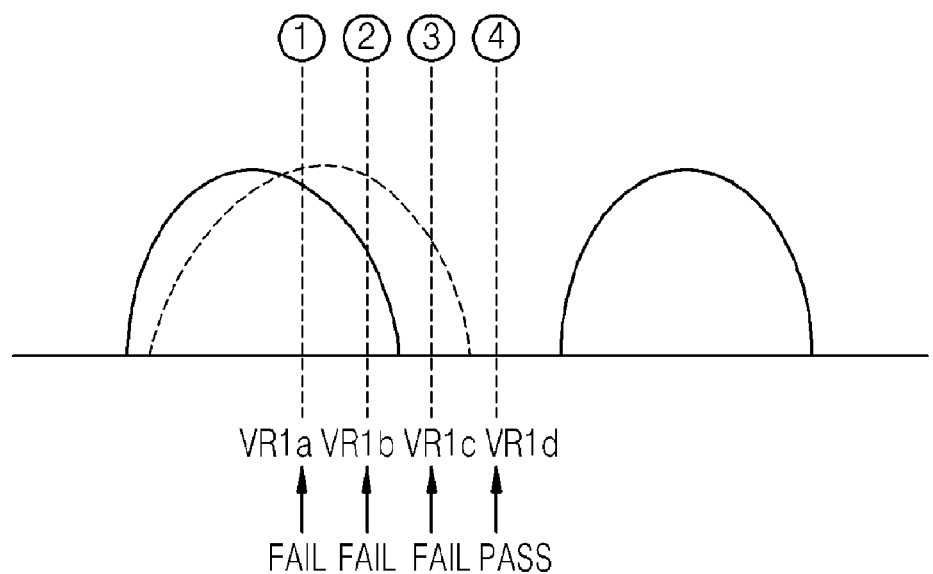
FIG. 5 is another diagram further illustrating an increase in the repetition number of a read operation according in response to a change in cell distribution according to an embodiment of the invention concept.

As will be appreciated at this point in the description of the illustrated embodiments, a maximum number of times that a read retry may be attempted must be defined within constituent memory system according to embodiments of the inventive concept. This number may be defined in relation to an expected collection of cell distributions for a flash memory and/or the time allocated for performance of a read operation within the memory system incorporating the flash memory. For example, assume that the target cell distribution of FIG. 4 worsens over time and repeated use of the flash memory device to become the cell distribution shown in FIG. 5. In response to this further worsening of the target cell distribution characteristics (i.e., the continued broadening), a memory system according to an embodiment of the inventive concept may increase the defined number of read retry oration from 2× to 3× and further define a fourth level read voltage "VR1$d$" associated with the additional read retry.

In essence, the scope and quality of read retry operations to-be-performed within a read operation executed in a flash memory device according to an embodiment of the inventive concept may be adjusted in response to the real time conditions of the cell distributions inherent in the flash memory device. For example, a certain number of failed read operations performed under the conditions illustrated in FIG. 4 may result in a redefinition of the read operation to include the conditions illustrated in FIG. 5. Such redefinition may require that the constituent memory system incorporating a flash memory according to an embodiment of the inventive concept to refine a maximum time allocated to execution of the read operation within the memory system. That is, an increase in the number of maximum retry operations within an overall read operation—as needed to address some deterioration in cell distribution characteristics—may also require that the constituent memory system increase the time allocated within the memory system for execution of the read operation.

Figure 6:
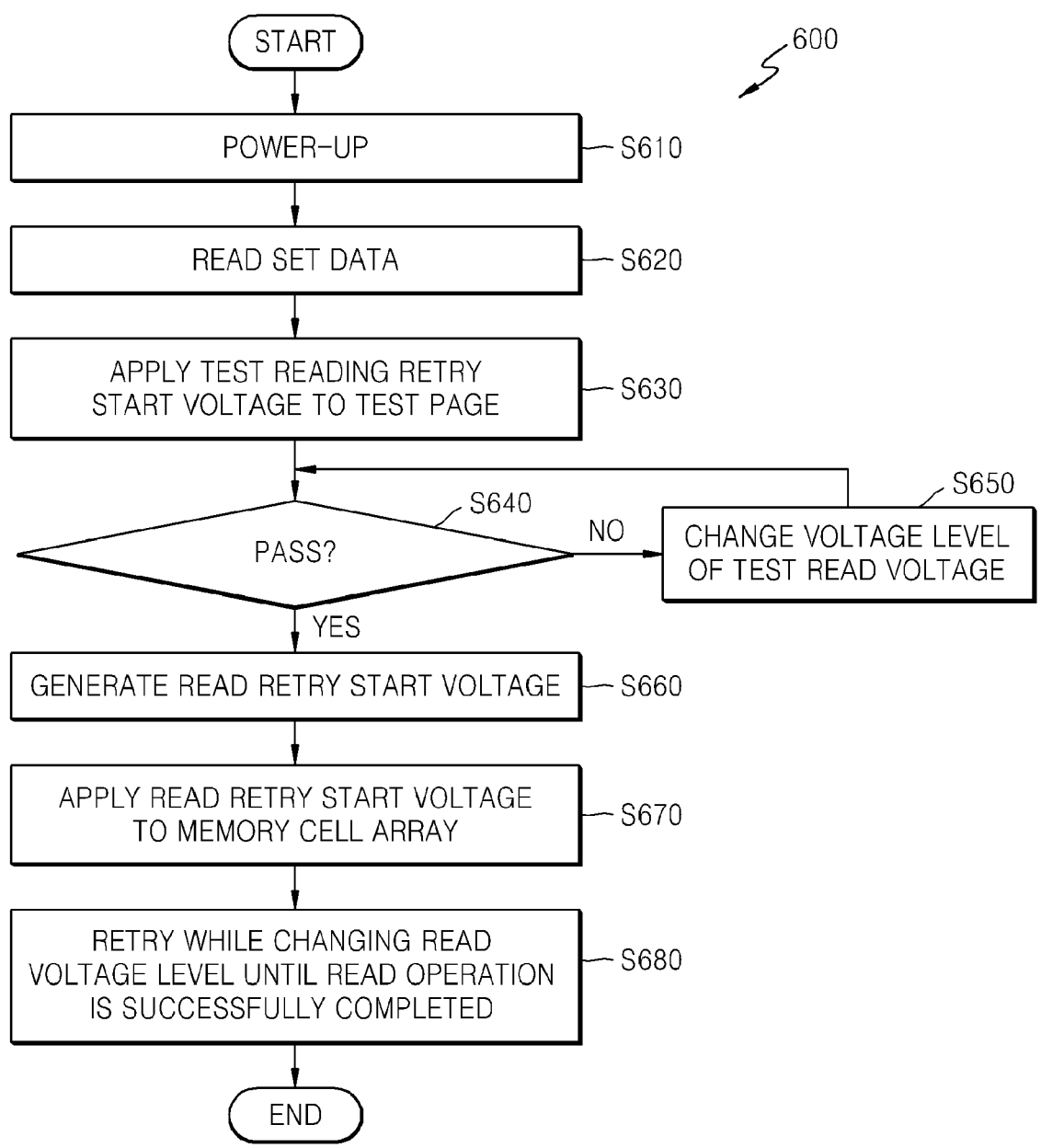
FIG. 6 is a flow chart summarizing a method of reading data of the flash memory device of FIG. 1 according to an embodiment of the inventive concept.

Accordingly, the flash memory device 10 illustrated in FIG. 1 comprises the read retry start voltage setting unit 180 and is configured to execute a read operation consistent with the method summarized in the flowchart of FIG. 6. The method summarized in FIG. 6 is capable of optimizing the number of read retry operations within a read operation in view of actual cell distribution conditions within a flash memory device.

Referring to FIGS. 1 and 6, with regard to the flash memory device 10 and a method of reading data from the flash memory device 10, when external power (PWR) is applied to the flash memory device 10 (S610), the controller 160 reads set data (SDATA) stored, for example in the memory cell array 110 (S620).

Figure 7:
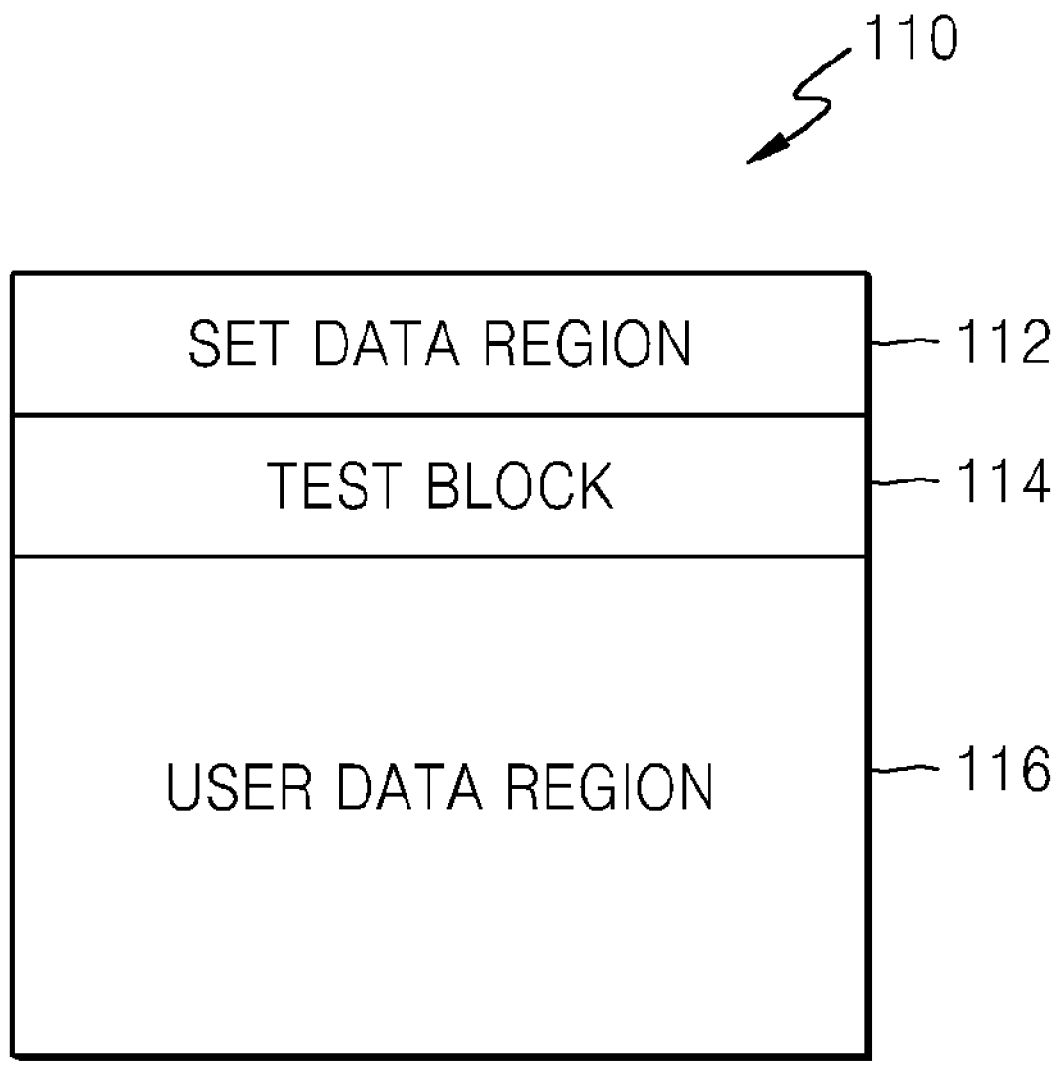
FIG. 7 is a diagram further illustrating one possible layout for the memory cell array of FIG. 1 according to an embodiment of the inventive concept.

As illustrated in FIG. 7, the memory cell array 110 may include a set data region 112 partitioned from a general user data region 116. User data will be programmed to and read from the user data region 116 of the memory cell array. However, the set data (SDATA) will be stored in the set data region 112.

The set data (SDATA) is data required to perform certain power-up operations for the memory device upon initial application of power to the controller 160. For example, the set data (SDATA) may be configured using an array of electrical fuses and may be considered E-FUSE data. The set data SDATA may include, for example, DC trim information, optionally configuration information, repair and bad block information, etc. In addition, the set data SDATA may in certain embodiments of the inventive concept include a test address (TAddr) indicating a logical location and/or physical location for test data (TDTA) stored in a test block 114 of memory cell array 110. In addition, the set data SDATA may in certain embodiments of the inventive concept include "read retry information" (IMVTR1) related, for example, to a test read retry start voltage (VTRn) level that is initially applied to a test page during a test read retry operation for reading the test data (TDTA) from the memory cell array 110.

Figure 8A:
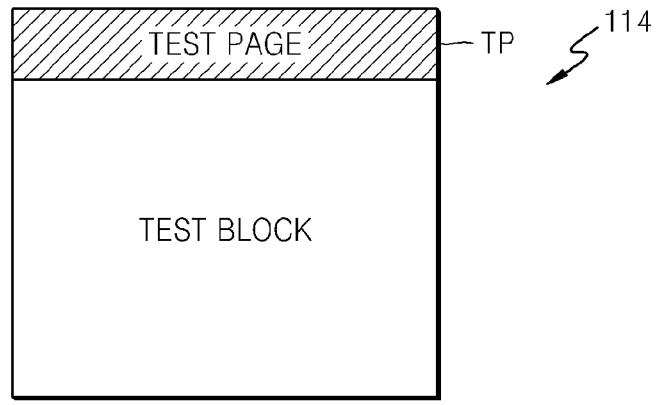
FIGS. 8A, 8B and 8C are additional diagrams illustrating possible locations for a test page within the test block of FIG. 7 according to an embodiment of the inventive concept.
Figure 8B:
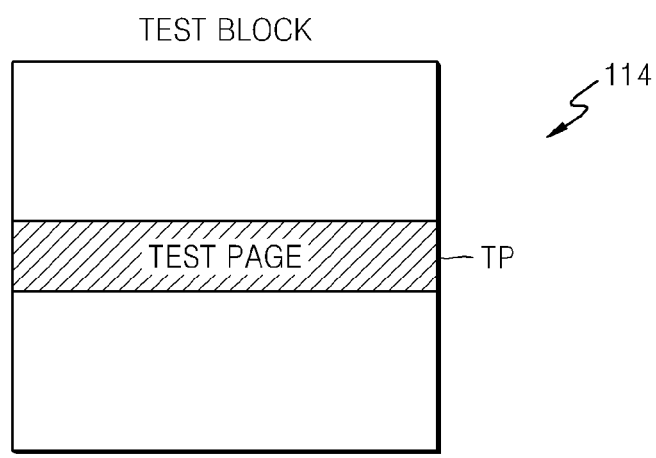
Figure 8C:
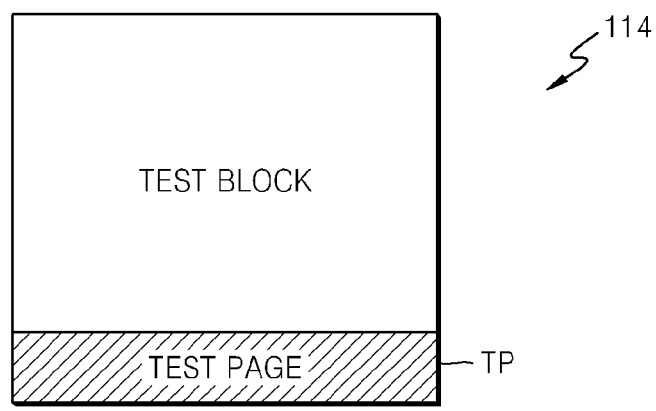

In certain embodiments of the inventive concept, the test block 114 may be provided within the user data region 116. For example, in FIG. 7, the test block 114 is located in a first portion of the user data region 116, but the inventive concept is not limited thereto. In addition, as illustrated in FIGS. 8A, 8B and 8C, the test block 114 may include a test page (TP). As illustrated in FIGS. 8A, 8B and 8C, the test page (TP) may be located at various locations of the test block 114.

The controller 160 receives the set data (SDATA) to obtain the test address (TAddr) and the read retry information (IMVTR1). Then, the controller 160 transmits the test address (TAddr) to the X-decoder/driver 120 and the Y-decoder/driver 130, and the X-decoder/driver 120 and the Y-decoder/driver 130 activate the test page (TP) in response to the test address (TAddr) and columns of the test page TP, respectively.

The controller 160 transmits a second control signal (XCON2) including the read retry information (IMVTR1) to the voltage generator 170. The voltage generator 170 generates the test read retry start voltage (VTR1) in response to the second control signal XCON2, and transmits the test read retry start voltage (VTR1) to the Y-decoder/driver 130. The Y-decoder/driver 130 applies the test read retry start voltage (VTR1) to columns of an activated page.

By performing the above described steps, the flash memory device 10 starts a read operation using the test read retry start voltage (VTR1), with respect to the test data (TDTA) (S630). With regard to the read operation applied to the test data (TDTA), an initial level of a test read voltage (VTR) is changed to the test read retry start voltage (VTR1) and then to successive read retry voltages, (VTR2 up to VTRpass). Thus, in effect, a read operation is performed (using multiple read retry iterations) in relation to the test data until the test data read operation has been successfully completed. (See, e.g., the exemplary read operation described in relation to FIG. 4 and directed to normal read data (RDTA)).

Throughout this iterative approach, the pass/fail determining unit 190 determines whether or not the read operation directed to the test data (TDTA) fails or succeeds (S640). Accordingly, the pass/fail determining unit 190 in the illustrated embodiment of FIG. 1 generates a third control signal (XCON3) indicating a read result of PASS or FAIL.

Thus, the controller 160 iteratively repeats the read retry operation with respect to the test data TDTA so long a failed read result is indicated (S640=NO), and for each successive read retry iteration changes the voltage level of the read voltage applied to the test data (S650). Ultimately, the read operation applied to the test data (TDTA) is successfully completed (S640=YES), as indicated by the third control signal (XCON3) provided by the pass/fail determining unit 190.

In certain embodiments of the inventive concept and during the test read operation, the test data (TDTA) will be stored in the page buffer 150 in a manner just like normal the read data (RDTA) typically read from the memory cell array 110. However, the test data (TDTA) in the foregoing examples is separately illustrated in order to distinguish it from normal read data.

Thus, the test read operation performed by the flash memory device 10 continues iteratively until a minimum test read retry level (VTRpass) is identified at which the test read retry operation may be successfully completed (S640=YES), At this time, the pass/fail determining unit 190 will transmit the third control signal (XCON3) including information identifying the minimum read retry voltage to be used during subsequent read operations. This minimum read retry voltage may be stored in the read retry start voltage setting unit 180.

The read retry start voltage setting unit 180 sets the minimum test read retry voltage (VTRpass) as a read retry start voltage VR1 in response to the third control signal (XCON3) (S660). In addition, the read retry information (IMVR1) regarding the read retry start voltage VR1 is transmitted to the voltage generator 170 and the controller 160.

The voltage generator 170 receives the read retry information IMVR1 including the read retry start voltage VR1 and then generates the read retry start voltage VR1.

The controller 160 then applies the read retry start voltage VR1 to a column corresponding to the address (Addr) through the Y-decoder/driver 130 (S670), and repeats the read operation while changing a read voltage level (refer to FIG. 4) until the read operation is successfully completed (S680).

As described above, the read operation may be performed as follows. The controller 160 transmits the address (Addr) to the X-decoder/driver 120 and the Y-decoder/driver 130, stores a page corresponding to the address (Addr) in the page buffer 150, and activates a column corresponding to the address (Addr). Then, the voltage generator 170 transmits the read voltage VR to the Y-decoder/driver 130, and the Y-decoder/driver 130 applies the read voltage VR to an activated column.

According to a flash memory device and read method consistent with an embodiment of the inventive concept, by performing a read retry operation using a read retry start voltage specifically suited to the actual cell distribution conditions for the flash memory, the operating speed of the flash memory device may be optimized in relation to the conditions with a highly reduced risk of read disturb occurrences since the iteratively applied read retry operations are minimized by the use of a properly ascribed read voltage.

Figure 9:
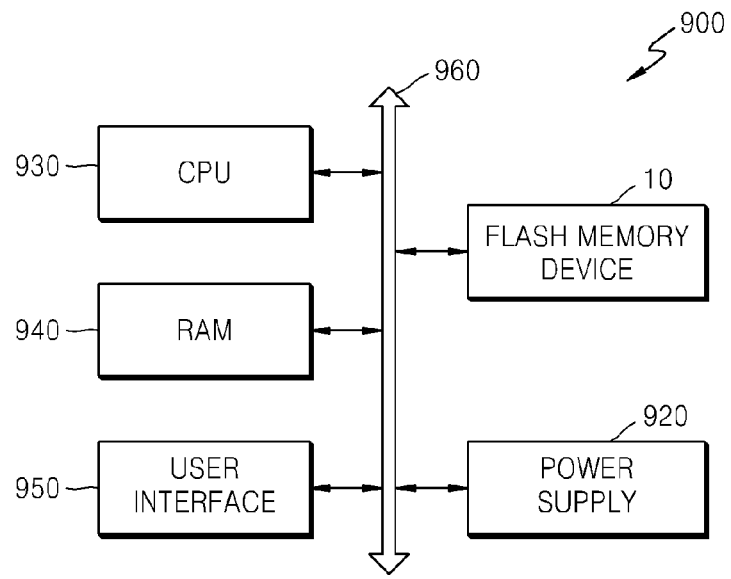
FIG. 9 is a block diagram of a computational system incorporating a flash memory device according to an embodiment of the inventive concept.

FIG. 9 is a block diagram of a computational system 900 incorporating a flash memory device according to an embodiment of the inventive concept. The computational system 900 comprises a microprocessor 930, a user interface 950, and the flash memory device 10 which are electrically connected to a bus 960. N-bit data, where N is a positive integer, processed by or to be processed by the microprocessor 930, may be stored in the flash memory device 10. The computational system 900 may further include a random access memory (RAM) 940 and a power supply 920.

When the computational system 900 is a mobile apparatus, a battery providing operating power to the computational system 900 and a modem such as a baseband chipset may be further provided. Those skilled in art will understand that the computational system 900 may further include an application chipset, a camera image processor (CIS), a mobile dynamic random access memory (DRAM), etc., and thus a detailed description thereof will be omitted. For example, the flash memory device 10 may be configured as a solid state driver/disk (SSD) using a nonvolatile memory for storing data.

Figure 10:
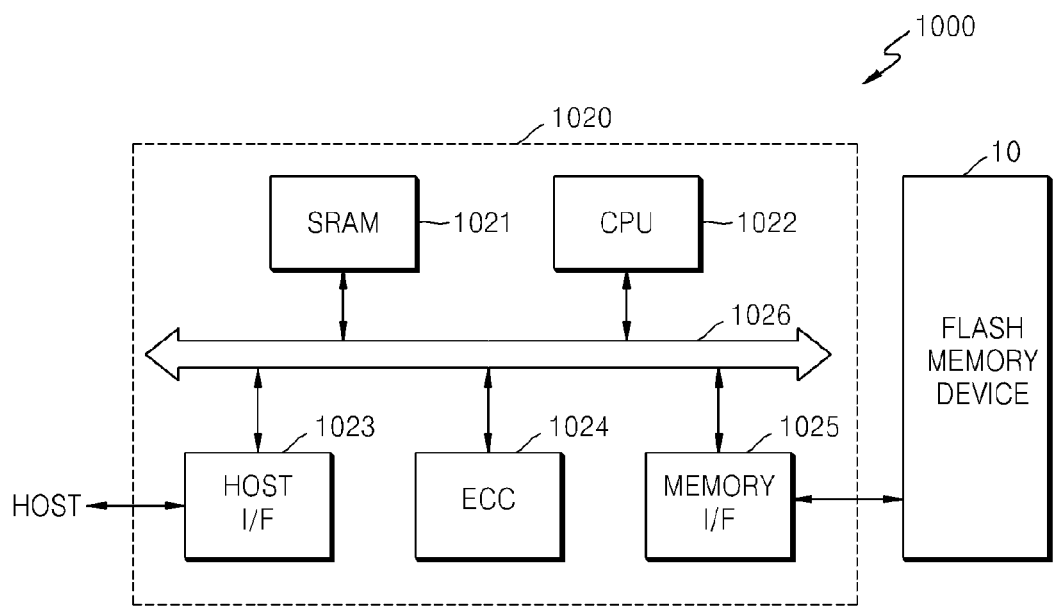
FIG. 10 is a block diagram of a memory card incorporating a flash memory device according to an embodiment of the inventive concept.

As illustrated in FIG. 10, the flash memory device 10 of FIG. 1 together with a controller 1020 may constitute a memory card 1000. In this case, the controller 1020 may communicate with an external element (e.g., a host apparatus) through one of various interface protocols such as USB, MMC, PCI-E, SATA, PATA, SCSI, ESDI, and IDE.

In FIG. 10, the structures and operations of a CPU 1022, an SRAM 1021, a HOST I/F 1023, an ECC 1024, a MEMORY I/F 1025 and a bus 1026 would have been obvious to one of ordinary skill in the art, and thus a detailed description thereof will be omitted.

The flash memory device 10 may be embedded using various packages, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

While the inventive concept has been particularly shown and described with reference to exemplary embodiments thereof, it will be understood that various changes in form and details may be made therein without departing from the scope of the following claims.

What is claimed is:

1. A method of reading data from a flash memory device, the method comprising:
    performing a test read operation directed to test data stored in a memory cell array of the flash memory device by iteratively applying a sequence of test read retry operations, wherein each successive test read retry operation uses a respectively higher test read voltage level than a preceding test read retry operation, until one test read retry operation in the sequence of test read retry operations successfully reads the test data using a minimum test read retry voltage associated with the one test read retry operation;

setting an initial read voltage for the flash memory device equal to the minimum test read retry voltage; and thereafter performing a normal read operation directed to user data stored in the memory cell array by iteratively applying a sequence of read retry operations, wherein an initial read retry operation in the sequence of read retry operations uses the initial read voltage.

2. The method of claim 1, wherein performing the test read operation is begun upon receiving power to the flash memory device during a power-up operation.

3. The method of claim 2, further comprising:

reading set data stored in the flash memory device after the power-up operation and before performing the test read operation to identify a test address at which the test data is stored, and obtain read retry information defining a read retry start voltage, wherein an initial test read retry operation in the sequence of test read retry operations is performed using the read retry start voltage.

4. The method of claim 1, wherein the sequence of read retry operations in the normal read operation comprises the initial read retry operation through an Nth read retry operation, and each read retry operation in sequence of read retry operations uses a respectively higher read voltage ranging from the initial read voltage having a lowest level to an Nth read voltage having a highest level.

5. The method of claim 4, wherein upon applying the Nth read retry operation and still failing to successfully read the user data, the method further comprises:

redefining the sequence of read retry operations to additionally include an N+1 read retry operation using a N+1 read voltage having a level higher than the highest level.

6. The method of claim 5, wherein upon redefining the sequence of read retry operations to additionally include the N+1 read retry operation, the method further comprises:

extending a time period within the flash memory device during which the normal read operation may be performed.

7. The method of claim 1, wherein the test read data is stored in a designated test block within the memory cell array of the flash memory device, and the user data is stored in a user data region separately designated from the test block.

8. The method of claim 7, wherein the test data is stored in a designated test page within the test block.

9. The method of claim 8, wherein the test page is a first page in the test block, a last page in the test block, or an intermediate page between the first and last pages in the test block.

10. A flash memory device comprising:

a memory cell array comprising a set data region, a test block, and a user data region;

a controller configured to control the execution of a normal read operation directed to user data stored in the user data region, and execution of a test read operation directed to test data stored in the test block, wherein execution of the normal read operation comprises iteratively applying a sequence of read retry operations, and execution of the test read operation comprises iteratively applying a sequence of test read retry operations, such that each successive test read retry operation uses a respectively higher test read voltage level than a preceding test read retry operation, until one test read retry operation in the sequence of test read retry operations successfully reads the test data using a minimum test read retry voltage associated with the one test read retry operation; and a read retry start voltage setting unit configured to store the minimum test read retry voltage as an initial read voltage;

wherein the sequence of read retry operations comprises the initial read retry operation through an Nth read retry operation, and each read retry operation in the sequence of read retry operations uses a respectively higher read voltage ranging from the initial read voltage having a lowest level to an Nth read voltage having a highest level.

11. The flash memory device of claim 10, wherein the controller is further configured to start the test read operation when power is supplied to the flash memory device during a power-up operation.

12. The flash memory device of claim 10, wherein the controller is further configured to read set data stored in the flash memory device, the set data indicating a test address at which the test data is stored, and read retry information defining a read retry start voltage, wherein an initial test read retry operation in the sequence of test read retry operations is performed using the read retry start voltage.

13. The flash memory device of claim 10, upon applying the Nth read retry operation and still failing to successfully read the user data during the normal read operation, the controller is further configured to redefine the sequence of read retry operations to additionally include an N+1 read retry operation using a N+1 read voltage having a level higher than the highest level.

14. The flash memory device of claim 13, wherein upon redefining the sequence of read retry operations to additionally include the N+1 read retry operation, the controller is further configured to extend a time period within the flash memory device during which the normal read operation may be performed.

15. The flash memory device of claim 10, wherein the test data is stored in the test block, and the user data is stored in the user data region separately designated from the test block.

16. The flash memory device of claim 15, wherein the test data is stored in a designated test page within the test block.

17. The flash memory device of claim 16, wherein the test page is a first page in the test block, a last page in the test block, or an intermediate page between the first and last pages in the test block.

18. A computational system comprising:

a central processing unit connected to a flash memory device via a system bus and configured to control execution of a normal read operation directed to user data stored in the flash memory device, wherein the flash memory device comprises;

a memory cell array comprising a set data region, a test block, and a user data region;

a controller configured to control the execution of a normal read operation directed to user data stored in the user data region, and execution of a test read operation directed to test data stored in the test block, wherein execution of the normal read operation comprises iteratively applying a sequence of read retry operations, and execution of the test read operation comprises iteratively applying a sequence of test read retry operations, such that each successive test read retry operation uses a respectively higher test read voltage level than a preceding test read retry operation, until one test read retry operation in the sequence of test read retry operations successfully reads the test data using a minimum test read retry voltage associated with the one test read retry operation; and a read retry start voltage setting unit configured to store the minimum test read retry voltage as an initial read voltage;

wherein the sequence of read retry operations comprises the initial read retry operation through an Nth read retry operation, and each read retry operation in the sequence of read retry operations uses a respectively higher read voltage ranging from the initial read voltage having a lowest level to an Nth read voltage having a highest level.

* * * * *